United States Patent
Aubel et al.

(10) Patent No.: US 9,543,199 B2
(45) Date of Patent: Jan. 10, 2017

(54) LONG-TERM HEAT TREATED INTEGRATED CIRCUIT ARRANGEMENTS AND METHODS FOR PRODUCING THE SAME

(71) Applicant: Infineon Technologies AG, Neubiberg (DE)

(72) Inventors: Oliver Aubel, Dresden (DE); Wolfgang Hasse, Stadthagen (DE); Martina Hommel, Nuertingen (DE); Heinrich Koerner, Bruckmuehl (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/138,241

(22) Filed: Dec. 23, 2013

(65) Prior Publication Data
US 2016/0049329 A1    Feb. 18, 2016

Related U.S. Application Data

(60) Division of application No. 11/589,349, filed on Oct. 30, 2006, now Pat. No. 8,643,183, which is a (Continued)

(30) Foreign Application Priority Data

Apr. 30, 2004    (DE) .......................... 10 2004 021 239

(51) Int. Cl.
*H01L 21/768* (2006.01)
*H01L 23/522* (2006.01)
*H01L 23/532* (2006.01)

(52) U.S. Cl.
CPC ... *H01L 21/76864* (2013.01); *H01L 21/76843* (2013.01); *H01L 21/76844* (2013.01); *H01L 21/76849* (2013.01); *H01L 21/76852* (2013.01); *H01L 21/76858* (2013.01); *H01L 21/76865* (2013.01); *H01L 21/76867* (2013.01); *H01L 21/76877* (2013.01); *H01L 21/76885* (2013.01); *H01L 21/76886* (2013.01); *H01L 23/5226* (2013.01); *H01L 23/53238* (2013.01); *H01L 2924/0002* (2013.01); *H01L 2924/3011* (2013.01)

(58) Field of Classification Search
CPC .................................. H01L 21/76843
USPC ......................................... 438/622
See application file for complete search history.

(56) References Cited

U.S. PATENT DOCUMENTS 6,339,258 B1 *  1/2002  Cooney, III ...... H01L 23/53233
                                                    257/751
2001/0055875 A1 * 12/2001 Sandhu .................... C23C 16/34
                                                    438/643

(Continued)

OTHER PUBLICATIONS

Wang et al. APL vol. 81, No. 8, Aug. 19, 2002, pp. 1453-1455.*

*Primary Examiner* — Matthew Landau
*Assistant Examiner* — Igwe U Anya
(74) *Attorney, Agent, or Firm* — Viering, Jentschura & Partner mbB

(57) ABSTRACT

An explanation is given of, inter alia, methods in which the barrier material is removed at a via bottom or at a via top area by long-term heat treatment. Concurrently or alternatively, interconnects are coated with barrier material in a simple and uncomplicated manner by means of the long-term heat treatment.

14 Claims, 5 Drawing Sheets

Related U.S. Application Data continuation of application No. PCT/EP2005/051808, filed on Apr. 22, 2005.

(56) References Cited

U.S. PATENT DOCUMENTS

| | | | | |
|---|---|---|---|---|
| 2002/0028579 A1* | 3/2002 | Cooney, III | ...... | H01L 23/53233 438/687 |
| 2004/0053446 A1* | 3/2004 | Matsubara | ........ | H01L 21/76843 438/118 |
| 2004/0188851 A1* | 9/2004 | Takewaki | .......... | H01L 21/76849 257/774 |
| 2004/0207085 A1* | 10/2004 | Fujii | ................. | H01L 21/76877 257/751 |
| 2005/0070097 A1* | 3/2005 | Barmak | ............ | H01L 21/76846 438/653 |
| 2005/0098897 A1* | 5/2005 | Edelstein | .......... | H01L 21/76846 257/762 |
| 2006/0113685 A1* | 6/2006 | Ueki | ................. | H01L 21/76886 257/785 |
| 2007/0280848 A1* | 12/2007 | Narayan | ................. | C23C 14/16 420/427 |

* cited by examiner

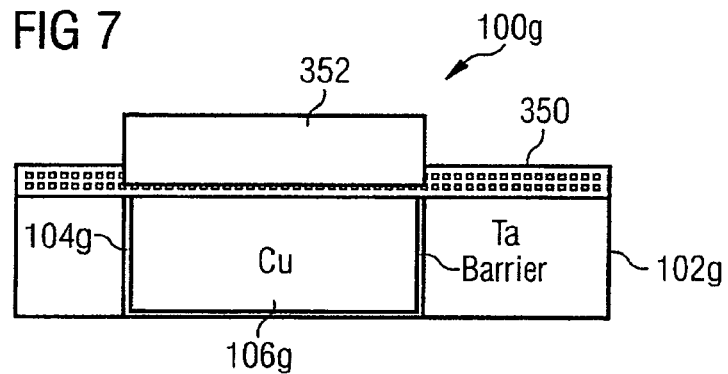
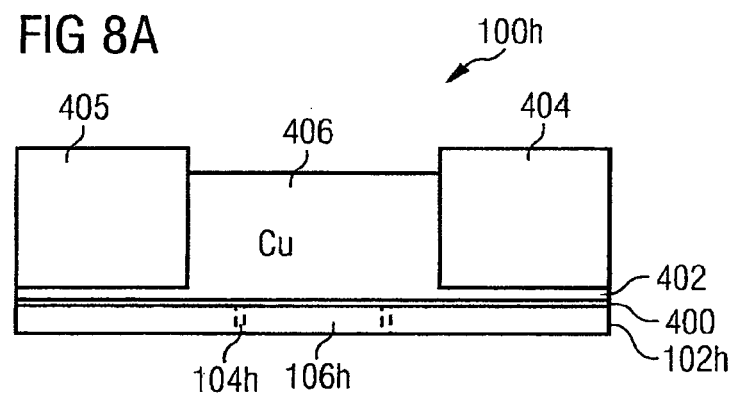
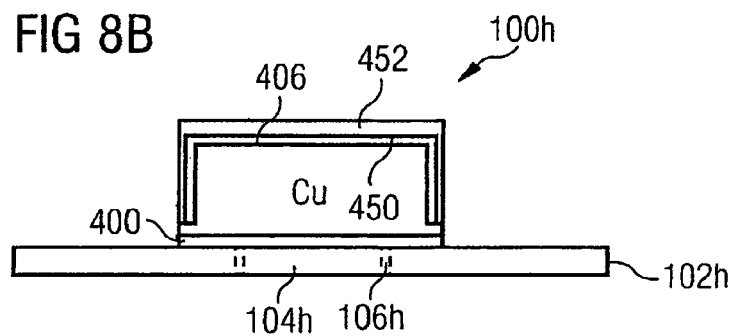

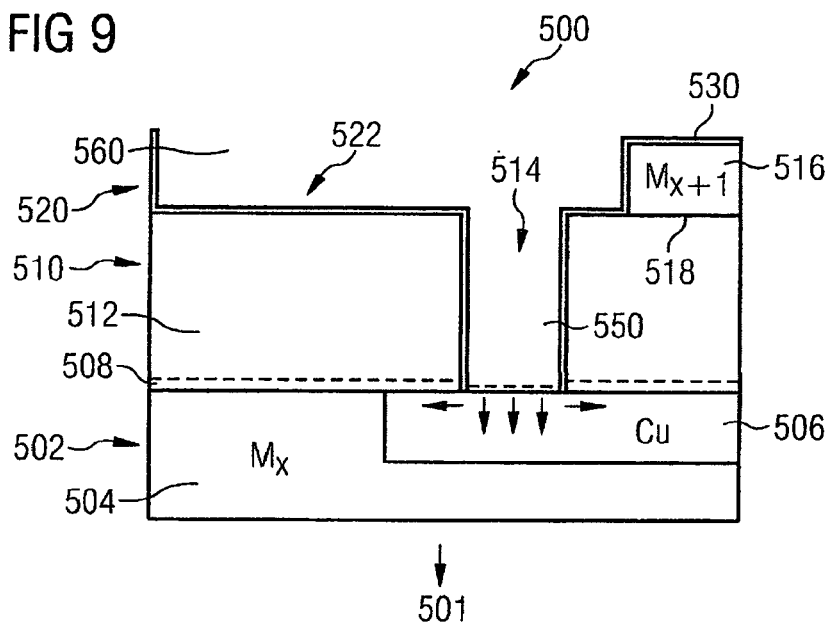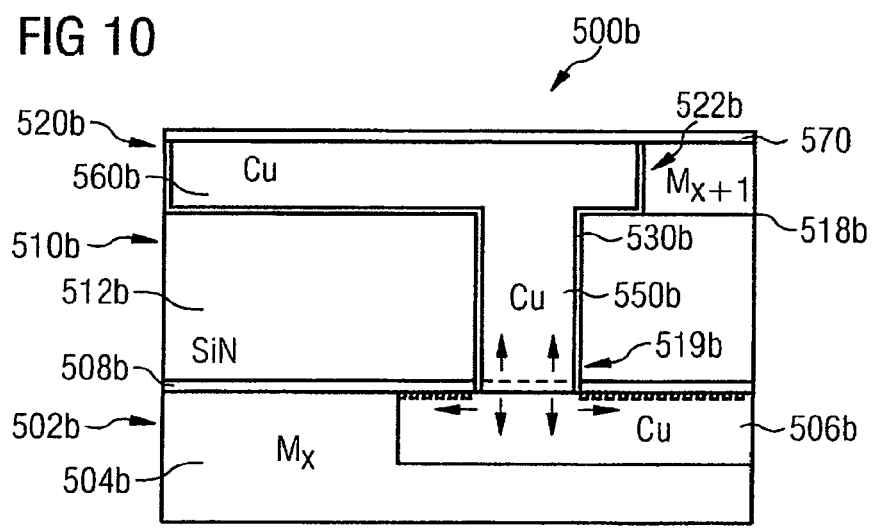

LONG-TERM HEAT TREATED INTEGRATED CIRCUIT ARRANGEMENTS AND METHODS FOR PRODUCING THE SAME

CROSS-REFERENCE TO RELATED APPLICATIONS

This application is a divisional application of co-pending U.S. application Ser. No. 11/589,349, filed Oct. 30, 2006, which is a continuation of international application PCT/EP2005/051808, filed Apr. 22, 2005, which claims priority to German Patent Application No. 10 2004 021 239.2 filed on Apr. 30, 2004, all of which are herein incorporated by reference.

BACKGROUND

1. Field of the Invention

The invention relates, inter alia, to an integrated circuit arrangement containing a multiplicity of conductive structures which are electrically conductive and which are structured in accordance with a grain structure. Conductive structures made of copper or made of a copper alloy are affected, in particular.

2. Description of Related Art

As minimum feature sizes decrease, a trend toward ever shorter heat treatment times can be observed in semiconductor technology. Both the total of the time for heat treatment operations and the duration of individual heat treatment steps are shortened because sufficient annealing of the material defects or sufficient grain formation already occurs even with short heat treatment operations given small dimensions. RTP methods with a heat treatment time of a few seconds are thus employed.

Interconnects made of copper are usually clad with a barrier material, which preferably does not form an alloy with copper and which constitutes a diffusion barrier for copper atoms against outdiffusion, into the intermetal dielectric or into the substrate. The electrical conductivity of the barrier material is lower than that of the copper. However, the lining increases the stability of the conductive structure against electromigration.

The conductive structures can be subdivided into vias and interconnects. The vias are arranged in insulating layers between two interconnect layers and serve for vertical current transport between the interconnects of different levels. The insulating layer with the vias additionally serves for the capacitive decoupling of interconnects of different levels.

SUMMARY

In one aspect of the invention, integrated circuit arrangements which are constructed simply and are simple to produce and the conductive structures are provided having a high current-carrying capacity on account of a reduced inclination toward electromigration. Moreover, methods are provided for producing such circuit arrangements.

The invention recognizes that heat treatment times, which are at least a factor of two or three longer by comparison with previous heat treatment times, considerably increase the current-carrying capacity of the conductive structures. This also applies to circuit arrangements having minimum feature sizes as a result of photolithography of less than 100 nanometers or even less than 50 nanometers taking into account the trend towards shorter heat treatment times.

Therefore, in the case of future generations of integrated circuits, the heat treatment time according to the invention lies below the heat treatment times that are customary nowadays, but at least a factor of two or three above the heat treatment times required without the use of the invention.

On account of the comparatively long heat treatment times, the thermal loading on the circuit arrangement during production increases without additional measures. However, the current-carrying capacity is considerably increased, which is of great importance for the function of the circuit arrangement particularly in the case of small feature sizes with initially a low current-carrying capacity.

In accordance with one aspect of the invention, the long heat treatment results in a penetration of the barrier material into the conductive structure along grain boundaries. This may initially lead to a rise in the electrical resistance of the conductive structure in the range of between 3% and 6%. Surprisingly, however, the current-carrying capacity can nevertheless be increased if the heat treatment is effected for a sufficiently long time that a barrier layer at via bottoms or at via top areas is resolved or greatly thinned. In the case of such a long heat treatment, the electrically conductive barrier material is partly arranged in a grain boundary region of the conductive structure which lies at least 5 nanometers or which lies at least 10 nanometers within the conductive structure.

In one development, the via conductive structure, at the sidewalls of which a barrier layer having a thickness of greater than 1 nanometer is arranged and at the bottom of which a barrier material layer thinner than 1 nanometer or no barrier material is arranged, adjoins an interconnect which is remote from the substrate and the bottom area of which adjoins a barrier material layer which is thicker than 1 nanometer. Particularly when using a dual damascene technique for producing the interconnect and the via conductive structure, barrier material at the via bottom can be removed selectively with respect to barrier material at the interconnect bottom by means of the heat treatment. The selectivity is caused e.g. by the fact that at the via bottom barrier material diffuses upward and downward during the heat treatment along grain boundaries and, if appropriate, in addition laterally along a Cu/SiN interface, while only diffusion upward along grain boundaries is possible at the interconnect bottom. In this method, the via conductive structure also contains barrier material in particular at least 5 nanometers or at least 10 nanometers within the via conductive structure. The barrier material is situated in the via conductive structure in particular in proximity to the interconnect.

However, the selectivity can also be achieved by effecting heat treatment if, after the deposition of barrier material at the via bottom, at the via sidewalls, at the interconnect bottom of the interconnect remote from the substrate and at the lateral areas of the interconnect remote from the substrate, conductive material or copper has not yet been introduced into the via and into the upper interconnect cutout. In this case, during the heat treatment, the barrier layer at the via bottom is thinned by material diffusion into the lower interconnect, while the rest of the barrier material does not adjoin conductive structures and, accordingly, cannot be transported away by grain boundary diffusion or, if appropriate, interface diffusion. In this configuration, the via conductive structure is free of barrier material or the via conductive structure is free of barrier material apart from one edge region or a plurality of edge regions extending to less than 5 nanometers within the via conductive structure (550). The little outdiffusion of barrier material can be attributed to short heat treatment operations that are carried out after the heat treatment for removing the barrier material at the via bottom.

In another development, the long heat treatment results in the removal or thinning of barrier material at a top area of a via conductive structure. The two abovementioned selective methods for removing the barrier material can also be applied here. When using the first method, the interconnect contains barrier material, in particular at least 5 nanometers or at least 10 nanometers within the interconnect. In the case of the second method, by contrast, the interconnect is free of barrier material or the interconnect is free of barrier material apart from one edge region or a plurality of edge regions extending to less than 5 nanometers within the via conductive structure.

The development is used in the case of conductive structures which have been produced either according to the single damascene method or according to a so-called subtractive method. The subtractive methods are used if damascene methods can no longer be employed, particularly in the case of an interconnect width of greater than 30 micrometers and/or an interconnect thickness of greater than 5 micrometers. High-current applications, in particular, require wide interconnects. On account of the high current density, the current-carrying capacity is then important for wide interconnects as well.

In one development, barrier material extends continuously from the edge of the conductive structure along a grain boundary as far as within the interconnect. However, in the case of very long heat treatments, it is also possible for the barrier material to "tear away", so that a gap arises between the location from which the barrier material has diffused into the grain boundary and the location at which the barrier material is arranged after production. However, in this case, too, the barrier material is arranged continuously along the grain boundary along a distance of greater than 5 nanometers or greater than 10 nanometers.

In a next development of the circuit arrangement according to the invention in accordance with the first aspect, there is an amorphous electrically conductive barrier material layer arranged in a manner adjoining the conductive structure. Such amorphous layers arise as a result of the long heat treatment. By way of example, there arises from body-centered cubic alpha tantalum given a heat treatment duration of greater than 30 minutes and a temperature of greater than 420° Celsius a narrow zone of amorphous tantalum at a Cu/Ta interface. With reference to the second aspect of the invention explained below, the amorphous material may be used for the outdiffusion of barrier material along interfaces. This means that barrier material is removed at the via bottom or at the via top area and barrier material is also applied to conductive structures by interface diffusion. In one configuration, the total heat treatment duration required is determined by the heat treatment duration determined for the removal if the interface diffusion proceeds more rapidly than the grain boundary diffusion between mutually adjacent grains of the conductive structure.

A second aspect of the invention, which can be used independently of the first aspect, recognizes that the long heat treatment results in barrier material diffusion along interfaces of the conductive structure with respect to a different material, for example with respect to a dielectric material. The interface diffusion is utilized in order to partly or completely cover the conductive structure with barrier material in a self-aligning manner. In this case, too, the electrical resistance of the interconnect rises in a range of between 3% and 6% on account of the grain boundary diffusion that cannot be prevented. However, the current-carrying capacity is considerably improved on account of the sheathing on all sides, so that the small increase in the resistance impairs the current-carrying capacity only to an insignificant extent.

The barrier material present prior to the interface diffusion, for example at the copper, may comprise a dielectric material which is intended to prevent outdiffusion of copper into a subsequently deposited dielectric. The barrier material may comprise silicon nitride SiN, however, in other exemplary embodiments, silicon carbide SiC, silicon carbon nitride SiCN, or a Blok material (Barrier low k) may also be used.

The combination of the two aspects in one integrated circuit arrangement leads to conductive structure which have a particularly high current-carrying capacity and which are surrounded with barrier material on all sides and do not have thick barrier material layers at via bottom and via top areas.

The material for the interface diffusion emerges particularly from amorphous material, or from amorphous regions, forming, for example during relatively long heat treatment. The circuit arrangement according to the second aspect therefore may contain a conductive structure which is electrically conductive and which adjoins an amorphous barrier material layer. In one configuration, a barrier material layer produced by the interface diffusion is thinner than 1 nanometer, in particular in regions with lateral dimensions of greater than 10 nanometers. Furthermore, the barrier material layer produced by interface diffusion is homogeneous with regard to its composition, for example elementary. In one configuration, the homogeneous barrier layer adjoins the interconnect on one side and a dielectric at the other side, that is to say that a double layer or multilayer comprising a plurality of electrically conductive layers having different material compositions or having different material structures is not used at at least one side of the interconnect.

In one development, the circuit arrangement additionally contains a polycrystalline electrically conductive barrier material layer arranged between the conductive structure 106 and the boundary material. The amorphous layer is arranged between the barrier material layer and the conductive structure and predominantly comprises an electrically conductive material which is also contained in the polycrystalline barrier layer or which the polycrystalline barrier layer comprises.

In one development of the circuit arrangement in accordance with the second aspect, at a top area of the conductive structure which is remote from the substrate, a barrier material layer is arranged without an overhang over a dielectric lying laterally with respect to the conductive structure. When using a photolithographic method for patterning a barrier layer on the top area, such an overhang may occur at two lateral areas of the conductive structure that are remote from one another. At the very least the overhang may occur at one lateral area, when using a photolithographic method. By contrast, there is no overhang when using a self-aligning method, that is to say, in particular, not in the case of the self-aligning coating by means of interface diffusion.

In one development the conductive structure is an interconnect which is completely surrounded with an electrically conductive barrier material apart from boundaries with respect to other conductive structures. A barrier layer having a layer thickness of greater than 2 nanometers or greater than 4 nanometers is arranged at at least one lateral area of the interconnect and a barrier layer having a layer thickness of less than 1 nanometer is arranged at at least one lateral area of the interconnect. The thicker barrier layer contains, in particular, the amorphous barrier layer and serves as a source for barrier material which is transported on account of the interface diffusion during the heat treatment and which forms the thin barrier layer.

In the next development, the conductive structure comprises copper or a copper alloy having at least 90 atomic percent of copper. As an alternative, the conductive structure comprises gold or a gold alloy having at least 90 atomic percent of gold. In another development, the barrier material is tantalum, tantalum nitride, titanium, titanium nitride, tungsten, tungsten nitride or titanium-tungsten. Other refractory metals or refractory metal alloys are also suitable.

The invention additionally relates to a method in which heat treatment is effected once or repeatedly. As a result of the heat treatment a barrier material layer between a via conductive structure and an interconnect is removed, perforated or thinned by at least 50% or by at least 90%. This method serves for producing a circuit arrangement in accordance with the first aspect, so that the technical effects mentioned above also apply to the method.

In one development, the barrier material is removed by diffusion along grain boundaries of a conductive structure and by interface diffusion along an interface between two different materials, the main part of the barrier material being transported away by grain boundary diffusion, but the interface diffusion has a supporting effect in particular in edge regions of the barrier material layer to be removed. In one alternative, only grain boundary diffusion is used.

In one configuration, the barrier material to be removed is deposited with a thickness of up to 2 nanometers, heat treatment being effected for at least 1.5 hours in total. If the barrier material to be removed has a thickness in the range of 2 nanometers to 5 nanometers, then, in another development, heat treatment is effected for at least 3 hours in total. The temperature during heat treatment is equal to 430° C. in this case. At temperatures of greater than 430° Celsius and less than 500° Celsius, the minimum heat treatment times specified are shortened and can be determined empirically, for example. Sufficient removal of the barrier material is ensured by complying with these heat treatment parameters. The upper limit for the heat treatment duration is determined by the instant at which sufficient barrier material has been removed. The throughput that is still tenable also determines the temperature and the heat treatment duration. Moreover, barrier material layers at sidewalls of the conductive structure should not be thinned to an excessively great extent. The heat treatment is effected, for example, in a continuous heat treatment operation for the times mentioned or with more heat treatment operations, the times mentioned relating to the total of the times for all the heat treatment operations. By way of example, layers are deposited or patterned between two heat treatment operations.

As an alternative measure to the heat treatment parameters, it can be specified that during the heat treatment barrier material to be removed is transported along grain boundaries by at least 5 nanometers or by at least 10 nanometers and is thus distributed sufficiently in order to increase the current-carrying capacity. The invention additionally relates to a further method in which heat treatment is effected once or repeatedly. During this heat treatment, secondary barrier material is transported from original barrier material by interface diffusion along the interface of a conductive structure, so that a circuit arrangement in accordance with the second aspect arises, in particular. The technical effects mentioned above thus also apply to the further method.

In one development, an original barrier layer is situated:
at a lateral area of the conductive structure,
at a boundary with respect to a via conductive structure,
or
on partial regions of the area of the conductive structure at which the interface diffusion occurs, the layer thickness of the original barrier layer in the partial regions being e.g. less than 10 nanometers or even less than 5 nanometers.

Amorphous original barrier layers are particularly well suited to being a source for the barrier material which diffuses along the interface. Amorphous original barrier layers are very useful in particular at edges and corners of the conductive structure which are difficult to coat. Amorphous original barrier layers are formed e.g. by heat treatment.

In one development, prior to the heat treatment for the interface diffusion, by means of prior heat treatment, barrier material is transported from within the interconnect to the outer area of the interconnect, in particular along grain boundaries. As an alternative, by means of prior heat treatment, barrier material is transported from an electrically conductive auxiliary region into a region of the interconnect in which the outer area of the interconnect lies after the removal of the auxiliary region. In this case, grain boundary diffusion occurs during the prior heat treatment. By means of the main heat treatment for the interface diffusion, barrier material is transported from the grain boundaries adjoining the interface to the interface and distributed there by interface diffusion.

As a measure for describing the main heat treatment operation, it can be specified that the transport distance of the barrier material during heat treatment with interface diffusion is greater than 10 nanometers or greater than 20 nanometers. The main heat treatment directly follows the prior heat treatment in one exemplary embodiment, In one configuration, the transport distance amounts to at least half the minimum interconnect width of an interconnect arranged in the circuit arrangement.

In one configuration, the conductive structure has a width of greater than 200 nanometers. In total, heat treatment is effected for more than 4 hours at 430° C. or for more than 8 hours at 430° C. In another exemplary embodiment, the conductive structure has a width in the range of 100 nanometers to 200 nanometers, in this case heat treatment being effected in total for more than 2.5 h at 430° C. for more than four hours at 430° C. In a further exemplary embodiment, the conductive structure has a width of greater than 50 nanometers and heat treatment is effected for more than 60 minutes (430° C.). In this case, the temperature during heat treatment is greater than 420° Celsius and less 510° Celsius or greater than 430° Celsius and less than 500° Celsius. Sufficient application of the barrier material in interconnect regions that are still uncovered is ensured by complying with these heat treatment parameters. The upper limit for the heat treatment duration is determined by the interconnect width or by the width of the interconnect and the width of deposits on regions of the conductive structure that are to be coated. Heat treatment is effected e.g. in a continuous heat treatment operation for the times mentioned or with more heat treatment operations, the times mentioned relating to the total of the times for all the heat treatment operations. By way of example, layers are deposited or patterned between two heat treatment operations. For the distance covered by interface diffusion, a root function specifies the dependence on the heat treatment time. Conversely, the dependence is quadratic, see Formula 1 at the end of the description.

In configurations, the heat required for the heat treatment is fed to the conductive structures to a greater extent than in the vicinity of the conductive structures, preferably by microwave coupling in, by inductive coupling in or by laser beam coupling in. The selective feeding of heat makes it possible to reduce the thermal loading on heat-sensitive regions of the circuit arrangement despite the long heat treatment duration and the high heat treatment temperatures. In particular diffusion regions of semiconductor components or heat-sensitive "low k" dielectrics are protected in this way.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIG. 7 shows a production stage of a method in which a barrier material layer is patterned by means of a photolithographic method;

FIGS. 8A and 8B show production stages of a method in which a conductive structure which has been produced by a different method than a damascene method is completely surrounded with a barrier material;

FIG. 9 shows a production stage of a method in which barrier material is removed at a via bottom into the underlying interconnect;

FIG. 10 shows a production stage of a method in which barrier material is removed at a via bottom into the underlying interconnect and into an adjoining via conductive structure.

DETAILED DESCRIPTION

Figure 1:
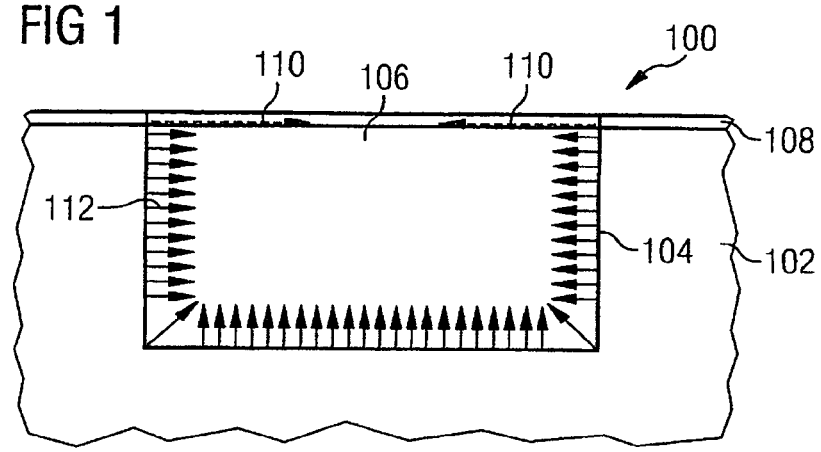
FIG. 1 shows a production stage for the coating of an interconnect by interface diffusion.

FIG. 1 shows a production stage for the coating of an interconnect by interface diffusion. An Integrated circuit arrangement 100 contains a multiplicity of semiconductor components, e.g. transistors, in a silicon substrate (not illustrated). Situated in an insulating layer 102 is a cutout lined with an electrically conductive barrier layer 104. The barrier layer 104 is, for example, a tantalum/tantalum nitride double layer in which the tantalum nitride lies at the insulating layer 102, or a tantalum layer, in particular an α-tantalum layer having a layer thickness in the range of 10 to 50 nm. In the exemplary embodiment, the cutout has a width of 600 nm, for example. Copper material was introduced into the cutout after the application of the barrier layer 104. The copper was subsequently planarized with the aid of a chemical mechanical polishing method (CMP), an interconnect 106 having been produced in the cutout. After the planarization, a dielectric barrier layer 108 was deposited over the whole area, for example a silicon nitride layer having a layer thickness in the range of 30 nm to 60 nm.

After the deposition of the dielectric barrier layer 108, a heat treatment method was carried out at temperatures of 450° C. for a time duration of 2 or more hours, barrier material 104 coating the top area of the interconnect 106 by interface diffusion along the interface between the dielectric barrier 108 and the interconnect 106 from both lateral areas of the interconnect 106, see arrows 110. A grain boundary diffusion that cannot be prevented occurs simultaneously, see arrows 112.

After the long heat treatment, barrier material has accumulated at the copper/silicon nitride interface, e.g. there is no longer a direct copper/silicon nitride interface at copper grain boundaries, with the result that the weakest location at the interconnect 106 with regard to electromigration has been eliminated. The consequence is a considerable increase in the current-carrying capacity of the interconnect 106, for example by a factor of eight in the case of 0.6 μm wide copper interconnects. Copper diffusion paths along the interface between copper and silicon nitride are blocked on account of the thin tantalum layer at the top area of the interconnect 106. This leads to a lengthened service life of the interconnect 106 and to an improved current-carrying capacity.

The long heat treatment differs at least in terms of time and/or temperature and also in terms of the process stage from the known first heat treatment after the copper deposition 106, which achieves the annealing of the grain and the microstructure. The barrier metal surprisingly diffuses more rapidly along the copper/SiN interface than along the copper grain boundaries. This leads to a comparatively rapid uniform distribution and accumulation of the tantalum at the critical interface. In this case, Cu/SiN represents by way of example all customary copper/dielectric interfaces, that is to say for example an interface between copper and SiC (silicon carbide), SiCN (silicon carbon nitride), BLOK (barrier with low dielectric constant k). In the exemplary embodiment, the tantalum layer that arises at the interface contains only a few atomic layers, for example only fewer than five atomic layers or only fewer than ten atomic layers. The long heat treatment additionally gives rise to an amorphous tantalum layer between the barrier layer 104 and the interconnect 106, from which tantalum layer emerges tantalum for the interface diffusion.

This is a simple, cost-effective process which is self-aligning and requires no lithography or etching steps to bring barrier material to the locations described and to act in the described manner. The apparatuses required for this are available in every fabrication or can be procured cost-effectively. Complicated lithography or etching steps and complex process controls are not required. The method can be applied both to damascene and to RIE (Reactive Ion Etching) interconnects. The method is applied in at least one or in all of the metal layers of the integrated circuit arrangement 100. Combinations with other thermal processes are also possible.

In the case of the exemplary embodiment illustrated with reference to FIG. 1, the tantalum interface diffusion was achieved at unexpectedly low temperatures starting from approximately 400° C. and less than 500° C. by means of the following measures:

the barrier layer 104 was present as a tantalum nitride/tantalum double layer, the $TaN_x$ component was substoichiometric, while X was less than 1 or less than 0.75, the tantalum metal of the barrier layer 104 was present partly as α-tantalum, that is to say as a body-centered cubic crystal structure, the dielectric barrier 108 was deposited as a multilayer layer by means of PECVD (Plasma Enhanced Chemical Vapor Deposition)

the barrier material, that is to say here the tantalum, did not form an alloy with the copper in the temperature range used during the heat treatment and exhibited a negligible solubility in copper, an amorphous zone highly rich in tantalum formed at the copper/tantalum interface, that is to say at the sidewall and at the bottom of the interconnect 106, in and from which zone tantalum outdiffuses during the surprisingly mild thermal activations cooling was effected comparatively slowly at the end of the activation process, where the cooling rate was less than 20 kelvins/minute, and a thin, amorphous tantalum-containing layer accumulated at the copper/silicon nitride boundary layer, and its effect commences at a thickness of a few atomic layers or already at fractions of an atomic layer.

The following experimental results hold true for the exemplary embodiment in accordance with FIG. 1:

the interface diffusion of the tantalum can be observed in the case of 0.6 μm wide interconnects 106 starting from 430° C. for heat treatment time of ten hours. This results in an improvement in the service life by at least a factor of 10 for a 0.6 μm wide interconnect 106 after storage at 450° C. for a heat treatment time of twenty hours without additional "supporting processes". Supporting processes serve for bringing barrier material in an intensified manner at or into the interface region at which the interface diffusion is intended to take place. In narrower tracks, a shorter heat treatment time is necessary because the diffusion length is proportional to the root of the heat treatment time. A heat treatment time of 2.2 hours at 450° C. thus results for a 200 nm wide track, that is to say for a 0.18 μn technology, given a diffusion length of 100 nm.

the tantalum diffusion could be demonstrated by means of SIMS (Secondary Ion Mass Spectrometry) and TEM (Transmission Electron Microscopy), and the tantalum diffusion led to an increase in resistance of less than 5% in 0.6 μm wide interconnects in conjunction with the significantly higher current-carrying capacity mentioned above.

Surprisingly, even small proportions of tantalum at the interface between the barrier material 108 and the copper 106, e.g. tantalum proportions of less than 5% of the interface, bring about a considerable increase in the electromigration strength, particularly if copper grain boundaries at the interface are covered with tantalum. In the explanation of the exemplary embodiments, tantalum is representative of all metallic barrier materials which do not form an alloy with copper in the temperature range used during the heat treatment and have only a very low solubility in copper. It is thus possible, for example, instead of tantalum or tantalum nitride, also to use tungsten, tungsten nitride, titanium-tungsten, titanium or titanium nitride as a barrier. As an alternative, the barrier material also originates from a nonconductive barrier or is electrically nonconductive. The corresponding element or the corresponding component then diffuses along the interface and leads to a uniform distribution at the interface. Incidentally, the methods explained with reference to the figures can be carried out in metallization levels that have been produced even by a single damascene method or by a dual damascene method. Moreover, the method steps can be applied if "subtractive" produced interconnects are used, that is to say e.g. by means of RIE, lift-off, pattern plating or the like.

The activation of the tantalum diffusion from the barrier may be effected after various process stages during wafer processing, e.g.:

after covering with silicon nitride or some other dielectric, but in particular prior to the production of further metallization layers of the circuit arrangement, after the completion of a specific metallization layer, but in particular prior to the production of further metallization layers, after the production of a plurality of metallization layers, but still prior to the production of further metallization layers, after the production of all the metallization layers of the circuit arrangement, but in particular still prior to the final passivation of the wafer, or after the final passivation of the wafer.

The procedure mentioned last has the advantage that the final heat treatment that is provided anyway and the heat treatment step can be carried out in a single method. The activation step may, if appropriate, also be combined with other steps prior to the delivery of the component, e.g. with a so-called burn-in step, in which the circuit arrangement is tested or stabilized at elevated temperature.

For the thermal activation of the wafer with regard to the interface diffusion here are the following possibilities, inter alia:

the thermal activation of the wafer or of individual components at temperatures of greater than 350° C. to 550° C. with the aid of a furnace process, in particular for different times, if a lower temperature budget has to be used, in order e.g. to preserve transistors, metallization elements or dielectrics from degradation, then it is also possible to use various methods for selectively heating the interconnects or for selectively heating edge regions of the interconnects inter alia:

selective heating of the interconnect by microwave excitation, preferably in the region of the resonant frequency of an interconnect. The resonant frequencies are length-dependent and are in the range of less 1000 GHz. The microwave excitation can be realized e.g. with the aid of a traveling wave tube (magnetron) or a cavity resonator.

the selective heating of the metal structures is likewise possible, e.g. by indirect heating or by inductive coupling in of energy into the wafer. Required frequencies are in the range of 10 kHz to 1 MHz. The skin effect is negligible on account of the interconnect dimensions. In a special case, structure elements that are already present on the wafer are used as heating wire or as a coil winding. Constructed for example from the metallic supporting locations that are required anyway in each level or from elements which are additionally integrated for this.

other methods of selective heating use optical methods for feeding in energy. The selectivity may be achieved e.g, by means of a spatial delimitation of the activated region, for example by locally heating the interconnect by means of a laser or by using the preferred light absorption and preferred heating of metallic structures in comparison with dielectrics, as is known for example in RTP methods (Rapid Thermal Processing).

In the following exemplary embodiments there are, for example, at least in some metallization layers, besides narrow interconnects having a width amounting to a minimum feature size, also significantly wider interconnects having a width of up to 25 μm depending on the technology and design rules. The currents flowing in the wide interconnects either have a comparatively low current density in comparison with the narrow tracks or, in high-current applications, the current densities in the wide interconnects are comparable with the current densities in the narrow interconnects. If so-called "low k dielectrics" are used instead of silicon dioxide as insulating material, they are thermally very sensitive. In the first-mentioned case, the diffusion path along the copper/silicon nitride interface is very long and the required amount of tantalum for saturating the interface is relatively large. In the second case, the thermal budget for the activation must be kept within permissible limits. In such cases, it is possible to employ further processes in a supporting manner which bring additional amounts of tantalum directly to or close to the later copper/silicon nitride interface. As a result, in particular in these special cases, the desired higher-current-carrying capacity is ensured without restriction. The supporting processes are explained in more detail below with reference to FIGS. 2 to 8B. An explanation is given here both of supporting processes which presuppose a long thermal application and of supporting processes which manage without such an activation or with a short thermal activation.

Figure 2:
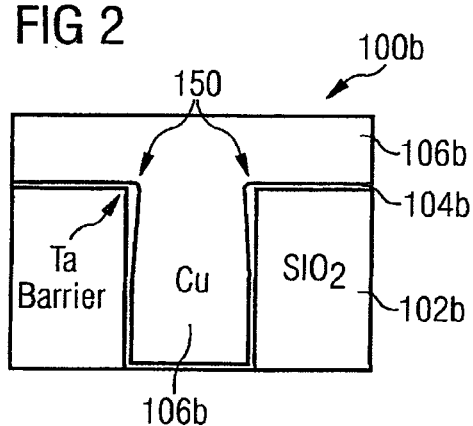
FIG. 2 shows a production stage of a method in which the interface diffusion is supported by non-conformal deposition of barrier material.

FIG. 2 shows a production stage of a method in which the interface diffusion is supported by non-conformal deposition of barrier material. A circuit arrangement 100b contains, in addition to a semiconductor substrate (not illustrated), an insulating layer 102b, e.g. made of silicon dioxide. A cutout for a copper interconnect 106b is produced with a small width in the range of 130 nm to 500 nm, for example. In order that the tantalum barrier or the tantalum nitride barrier at the sidewall of the interconnect 106 is not "thinned" to an excessively great extent by the material transport that arises during the later heat treatment, the amount of tantalum required for the interface diffusion is already deposited beforehand by means of a targeted extra deposition during the application of a barrier layer 104b, for example by using a PVD method (Physical Vapor Deposition) performed non-conformally. As a result, the majority of the material is deposited in the upper region of the cutout or trench and thus close to the copper/silicon nitride interface at which the faster diffusion takes place. The non-conformal deposition can be further supported by a suitable choice of the plasma voltages and the gas flows during the PVD method. It is also possible to avoid thinning of the barrier material at the sidewalls of the interconnect 106b or an excessively high "incompatible" temperature budget by using in addition "supporting" processes such as are explained below with reference to FIGS. 3 to 8B.

In the method in accordance with FIG. 2, the non-conformal deposition is the supporting process. The production stage illustrated in FIG. 2 is followed by a planarization step in which the copper and tantalum projecting beyond the cutout are removed with the aid of a chemical mechanical polishing method. A dielectric barrier layer, for example, a silicon nitride layer, is subsequently deposited. Silicon dioxide, for example, for the next via or metallization layer is then deposited. The long heat treatment with interface diffusion is subsequently carried out.

Figure 3:
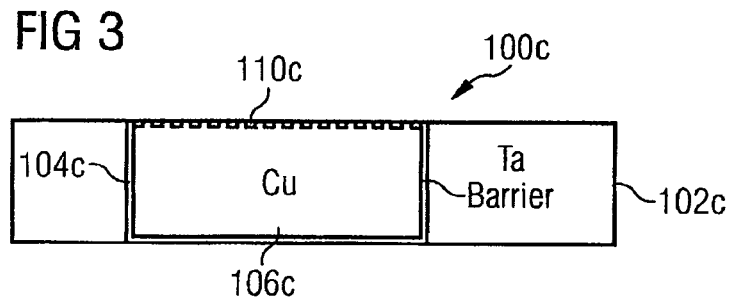
FIG. 3 shows a production stage of a method in which, after a selective coating, regions that are still uncoated are coated by interface diffusion.

As illustrated in FIG. 3, a circuit arrangement 100c is produced by introducing a cutout for an interconnect into an insulating layer 102c. An electrically conductive barrier layer 104c, for example, a tantalum layer, is deposited over the whole area. Afterward, copper is deposited and planarized, tantalum also being removed outside the cutout for an interconnect 106c. Afterward, in a first method variant, tantalum is deposited selectively by means of a CVD process (Chemical Vapor Deposition) using for example, $TaCl_5$ or $Ta(OC_2H_5)_5$ and hydrogen-containing or other reducing gases. The selective deposition of tantalum by means of CVD is effected at 400° C., for example.

Directly after the CMP step and a cleaning step that is carried out, if appropriate, the metallic copper surface is particularly reactive and a suitable surface for the selective deposition of tantalum, because hydrogen readily dissociates at it and the deposition of tantalum can be effected at relatively low temperatures.

In a second method variant, after the CMP method, tantalum is deposited selectively by means of an external-current-free deposition from an electrolyte solution. If appropriate, a cleaning step and a pretreatment and also a suitable activation of the interconnect surface are carried out beforehand.

In both method variants, the selective deposition of tantalum is followed by the application of a dielectric barrier layer, for example, a silicon nitride layer. This is followed by the application of the next insulating layer, for example silicon dioxide. The long heat treatment for bringing about the interface diffusion is effected at this point in time or at a later point in time.

In the exemplary embodiment, an electrically conductive barrier layer having a layer thickness of less than 10 nm or even having a layer thickness of less than 5 nm is deposited selectively. With such thin selectively deposited layers, it cannot be ensured that the top area of the interconnect 106c is completely covered. Particularly at the defects or at contaminated locations at which, for example, copper oxides have already formed, there are regions which are still not covered with tantalum. What is achieved by means of the long heat treatment step is that these regions, too, are covered with tantalum and thus considerably increase the current-carrying capacity of the interconnect 106c. It is also noted that reference numeral 110c refers to tantalum.

Figure 4:
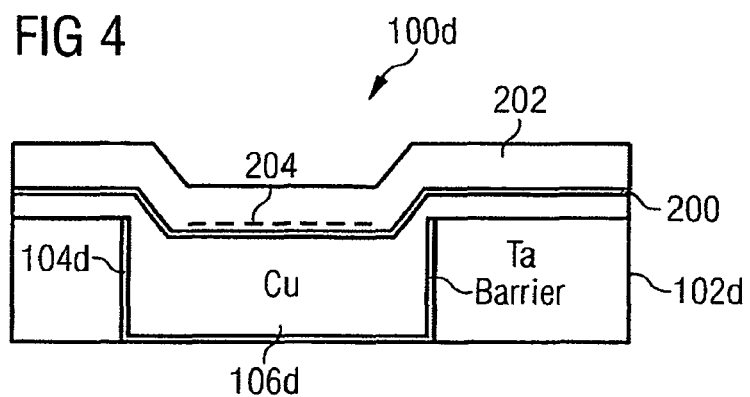
FIG. 4 shows a production stage of a method in which barrier material introduced within the interconnect, by means of prior heat treatment, is transported from within the interconnect to a later outer area of the interconnect.

FIG. 4 shows a further "supporting" process. During the production of a circuit arrangement 100d, a cutout for an interconnect 106d is produced in an insulating layer 102d. After the production of the cutout, a tantalum barrier layer 104d is deposited over the whole area. Copper is then electrodeposited with the aid of a voltage source. Before, precisely when or directly after the cutout has been completely filled with copper, an auxiliary layer 200 made of electrically conductive barrier material, e.g. made of tantalum, is deposited, for example with a thickness of 30 nm to 50 nm. After the deposition of the auxiliary layer 200, copper is further deposited in the cutout so that copper lies between the auxiliary layer 200 and the opening 204 of the cutout. A CMP method is subsequently carried out in order to remove copper and tantalum lying outside the cutout. The CMP method is ended upon reaching the opening 204 of the cutout. Afterward, a dielectric layer, in particular a barrier layer, e.g. a silicon nitride layer, is deposited and the long heat treatment step with interface diffusion is carried out. In this case, barrier material 104d diffuses from the lateral areas of the interconnect 106d along the interface to the silicon nitride layer/copper interconnect 106d. Moreover, material of the auxiliary layer 200 diffuses from within the interconnect 106d along grain boundaries to the silicon nitride/copper interface and is distributed at the interface by interface diffusion. It is further noted that reference 202 refers to a copper layer.

For the deposition of the auxiliary layer 200, a first method variant utilizes an electrolytic deposition of a strongly tantalum-containing component from a two-component electrolysis bath containing copper compounds and tantalum compounds, in particular complex compounds. By altering the electroplating voltage, it is possible to change over to the deposition of the auxiliary layer 200. After the deposition of a sufficiently thick auxiliary layer, the voltage is switched back again, so that primarily copper is deposited again. The thickness of the auxiliary layer 200 can be controlled for example by way of the electrolysis current. The required electrolysis voltages can be set sufficiently differently and in well-controllable ranges by suitable choice of the complexing agents and the pH value.

In a second method variant, separate electrolysis baths in separate installations or in two adjacent chambers of a multichamber installation are used for the deposition of the copper and for the deposition of the auxiliary layer 200.

Figure 5:
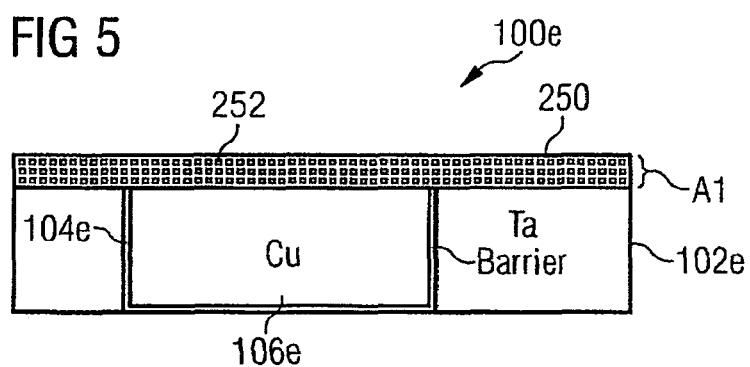
FIG. 5 shows a production stage of a method in which, by means of prior heat treatment, barrier material is transported from an auxiliary region adjoining the interconnect to a later outer area of the interconnect.

FIG. 5 shows a production stage of a "supporting" process in which, for the production of a circuit arrangement 100e, a cutout for an interconnect 106e is produced in an insulation layer 102e. After the production of the cutout, a barrier layer 104e, for example, made of tantalum, is deposited over the whole area. Afterward, copper is deposited with the aid of a method in which, in period alternation, copper is deposited and then partially removed purely electrochemically or with mechanical support. By way of example, the company Nutool offers such a method under the name "ECMD". The application of such a method leads to a planar copper surface having only a small copper layer thickness to be removed by CMP above the opening of the cutout for the interconnect 106e. By way of example, the layer thickness of the copper outside the cutout for the interconnect 106e is in a range of 30 nm to 60 nm, see distance A1. After the application of the copper, a thin barrier layer 250, for example, made of tantalum, is applied over the whole area, for example by sputtering. The thickness of the tantalum layer 250 is the range of 30 nm to 50 nm, by way of example.

A drive-in step is subsequently carried out, in which material of the tantalum layer 250 diffuses along grain boundaries right into the vicinity of the opening of the cutout along grain boundaries. If appropriate, the drive-in step is carried out until driven-in barrier material lies more than 10 nanometers or more than 20 nanometers within the cutout for the interconnect 106e.

After the prior heat treatment step, a CMP method is carried out, in which copper and material of the tantalum barrier 104e are removed outside the cutout. The dielectric barrier layer, e.g. a silicon nitride layer, is subsequently deposited. In the further course of producing the circuit arrangement 100e, a long main heat treatment step with interface diffusion is carried out, in which barrier material 252 emerges at grain boundaries within the interconnect 106e to the copper/silicon nitride interface and diffuses there at the interface. Moreover, interface diffusion of barrier material originating from the tantalum barrier 104e occurs.

Figure 6:
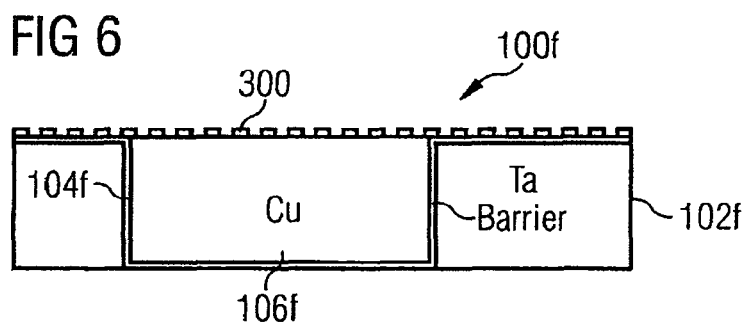
FIG. 6 shows a production stage of a method in which a CMP process is interrupted in order to deposit barrier material over the whole area and to drive it in by means of prior heat treatment in grain boundaries.

FIG. 6 shows a further variant for a "supporting" process during the production of a circuit arrangement 100f containing an insulating layer 102f. A cutout for an interconnect 106f is produced in the insulating layer 102f with the aid of a photolithographic method. A barrier layer 104f, e.g. a tantalum layer, is deposited in the cutout. Afterward, copper is electrodeposited and planarized as far as the barrier layer 104f with the aid of a CMP method. The CMP method is interrupted upon reaching the barrier layer 104f. The reaching of the barrier layer 104f is detected automatically by means of an end point detection, for example, and can be determined in a simple manner. A thin tantalum barrier, for example with a layer thickness of less than 20 nanometers or less than 5' nanometers, is subsequently applied. Suitable methods for applying the barrier layer 300 are CVD, PVD, electrolytic depositions or implantations.

After the application of the barrier layer 300, a prior heat treatment is carried out, in which material at the barrier layer 300 penetrates along grain boundaries into the interconnect 106f, in particular into regions which are more than 10 nanometers or more than 20 nanometers away from the opening of the cutout for the interconnect 106f. Material of the barrier layer 106f is then removed outside the cutout for the interconnect 106f with the aid of a CMP method. After the conclusion of the CMP method, a barrier layer, e.g. made of silicon nitride layer, corresponding to the barrier layer 108 is deposited. In the further course of the method, a longer heat treatment is carried out, in which barrier material of the barrier layer 300 is driven out from the grain boundaries to the copper/silicon nitride interface and diffuse along said interface. In addition, interface diffusion of barrier material originating from the barrier layer 104f also occurs.

FIG. 7 shows a "supporting" process in which an insulating layer 102g made of silicon dioxide is applied during the production of a circuit arrangement 100g. A cutout for an interconnect 106g is produced in the insulating layer 102g. After the production of the cutout, an electrically conductive barrier layer 104g is deposited over the whole area, for example a tantalum layer, having a layer thickness in the range of 10 to 30 nm. Afterward, copper is deposited and it is planarized, copper and material of the barrier 104g being removed outside the cutout for the interconnect 106g. After the planarization, a thin tantalum layer 350 is applied over the whole area, for example with a layer thickness of less than 10 nm or even less than 5 nm. The tantalum layer 350 is subsequently patterned with the aid of a photolithographic method, a resist region 352 that covers the interconnect 106g being used. After the removal of the resist, a dielectric barrier layer, e.g. a silicon nitride layer, is deposited. After the deposition of the silicon nitride layer, a heat treatment is carried out in the further course of the method, by means of which heat treatment the still uncovered regions of the top area of the interconnect 106g are covered with barrier material on account of interface diffusion.

FIGS. 8A and 8B show production stages in the production of an integrated circuit arrangement 100h. After the production of an insulating layer 102h and a via conductive structure 106h embedded therein, a barrier layer 400 is deposited over the whole area, for example a tantalum layer having a layer thickness in the range from 10 nm to 50 nm. After the deposition of the barrier layer 400, a seeding layer made of copper is deposited on the barrier layer 400. A resist layer is then applied and patterned giving rise to resist regions 404 and 405 between which a cutout for an interconnect 406 is arranged, which is subsequently produced with the aid of a galvanic method by selective (local) deposition into the opening. The resist regions 404 and 405 are removed after the production of the interconnect 406. Afterward, as shown in FIG. 8B, a thin barrier layer 450 is deposited, which covers the top area of the interconnect 406 and the lateral areas of the interconnect 406. The barrier layer 450 comprises tantalum, for example, and has a layer thickness of, for example, less than 10 nm or less than 5 nm. The barrier layer 450 is deposited for example by means of a CVD method, by means of a PVD method or by means of an external-current-free galvanic method. After the deposition of the barrier layer 450, a dielectric barrier layer 452 is deposited, e.g. a silicon nitride layer, in order to form an interface at regions of the interconnect 406 which are not covered by the barrier layer 450.

After the deposition of the silicon nitride layer 452, a longer heat treatment is carried out in order also to cover with tantalum the regions not yet covered by tantalum from the top area of the interconnect 406 or at the lateral areas of the interconnect 106 by interface diffusion of tantalum.

The layer stack arranged on the insulating layer 102h and comprising the silicon nitride layer 452, the barrier layer 450, the seeding layer 402 and the barrier layer 400 is then removed with the aid of a photolithographic method or with the aid of an anisotropic etching method. The interconnect 406 thus remains surrounded by a tantalum layer. As a result of the long heat treatment, the barrier layer 400 is however also thinned or removed at the boundary between the interconnect 104h and the interconnect 406.

In further exemplary embodiments, the interconnect 406 is produced with the aid of a copper RIE method (Reactive Ion Etching), with the aid of a so-called lift-off method or with the aid of a different "subtractive" method.

In all the variants explained with reference to FIGS. 1 to 8B, additional tantalum is brought directly to or close to the horizontal or vertical (FIG. 8B) copper/dielectric interface. Material arranged close to the interface can be driven to the later copper layer of the silicon nitride interface by means of a subsequent short activation. In other cases, first the silicon nitride covering layer is applied and the barrier metal is then distributed by diffusion along the copper/dielectric interface. In all cases in which a "supporting" process is used, the material introduced in a "supporting" manner may also be different from those in the metallic diffusion barrier 104 used.

If the "supporting" process step is chosen suitably, the additionally applied tantalum is already present in a manner distributed uniformly at the desired location, namely directly at the copper/silicon nitride interface, and the additionally required activation step can be carried out during a final heat treatment step at e.g. 430° C. for 30 minutes. In specific cases, no additional heat treatment time is required as a result for the long thermal step.

Figure 11:
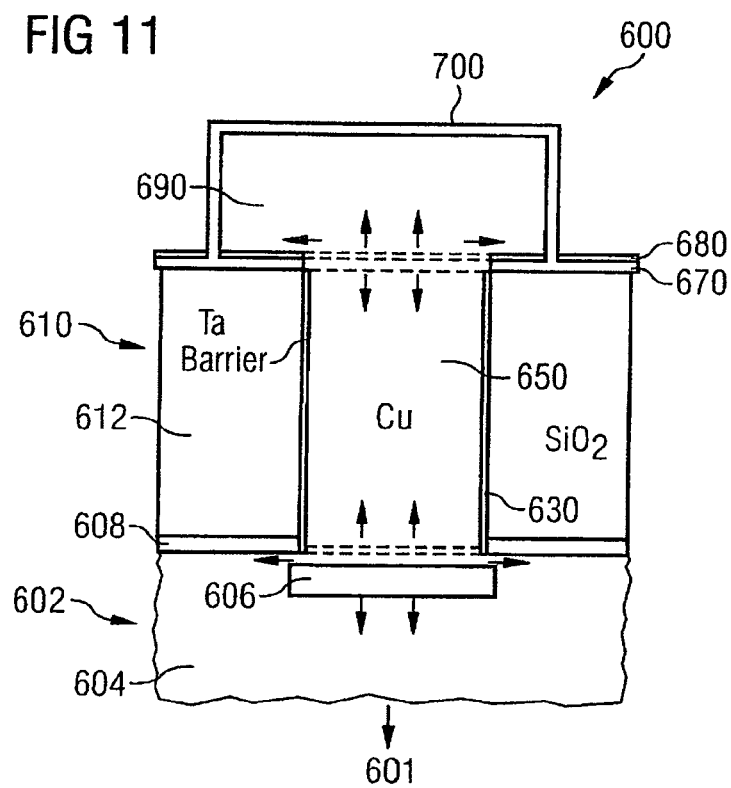
FIG. 11 shows a production stage of a method in which barrier material is removed at a via top area.

FIGS. 9 to 11 relate to exemplary embodiments in which barrier material is primarily intended to be removed from the bottom of a via conductive structure or between two conductive structures. A combination with methods in which tantalum is applied by interface diffusion is possible and is also mentioned repeatedly below. By means of the exemplary embodiments explained with reference to FIGS. 9 to 11, the nonreactive via resistance decreases considerably and the current-carrying capacity of the via increases. In all three exemplary embodiments, firstly a whole-area deposition of an electrically conductive diffusion barrier layer is carried out. In order to remove the barrier layer in the region of the via/track transition, a surprising mild heat treatment process is used in which the barrier material diffuses in copper or along interfaces, e.g. copper/tantalum or copper/silicon nitride.

In the exemplary embodiments, in which heat treatment temperatures of between 400 and 500° C. were used, the following conditions were complied with: —the barrier comprised a double layer of tantalum nitride/tantalum, the $TaN_x$ component was substoichiometric, i.e. X<1 or X<0.75, the tantalum metal of the barrier was present at least in part as α-tantalum, that is to say as a body-centered cubic lattice, an amorphous zone highly rich in tantalum forms at the copper/tantalum interface, that is to say at the sidewall and at the bottom of the conductive structures, in and from which zone tantalum diffuses during surprisingly mild thermal activations, and there are no restrictions here in the selection of the barrier material. It may, but need not, form copper alloys in the relevant temperature range during the heat treatment or may have a finite solubility in copper. Consequently, the methods are not just restricted to tantalum barriers.

The exemplary embodiments of FIGS. 9 and 10 relate to dual damascene architectures. However, the methods discussed can also be utilized in the case of single damascene architectures or else, as illustrated in FIG. 11, in the case of interconnects which have been produced by subtractive methods, that is to say by lift-off methods, by pattern plating or by copper RIE. The heat treatment step for removing the barrier material can be carried out in or after various process stages, see the possibilities explained above of FIGS. 1 to 8B.

The following advantages are afforded:
reliable, reproducible and low-risk procedure, the via resistance being reduced and the electromigration strength being increased, cost-effective thermal processes are used which can generally be carried out without the need for capital expenditure or without the need for high capital expenditure, cost-effective batch processes are used, and additional positive effects occur at all the layers and interfaces as a result of the long heat treatment.

The thermal activation is carried out at temperatures of ≥350° to 550° C. for different lengths of time which are essentially dependent on the thickness of the barrier layer. The abovementioned methods for selectively heating the metallic structures are also employed in the heat treatment methods for the removal of barrier material.

FIG. 9 shows a circuit arrangement 500 having a substrate 501. After the production of integrated semiconductor components in the substrate 501, an insulating layer 502 containing insulating material 504, for example silicon dioxide, was produced. An interconnect 506 made of copper was produced in the insulating layer 502 with the aid of a dual damascene method. A dielectric barrier layer 508, for example a silicon nitride layer with a layer thickness of 50 nm, was subsequently deposited. A via layer 510 and an interconnect layer 520 are subsequently produced with the aid of a dual damascene method. A cutout 514 is introduced in an insulating material 512 of the via layer 510. A cutout 522 for an interconnect 560 is introduced into an insulating material 516 of the interconnect layer 520. If appropriate, an etching stop layer 518, for example a silicon nitride layer, is arranged between the via layer 510 and the interconnect layer 520.

FIG. 9 shows a production stage in which the cutouts 514 and 522 have not yet been filled with copper. However, a barrier layer 530, for example a tantalum layer having a layer thickness of 20 nm, has already been deposited over the whole area. A barrier material layer having a layer thickness of 10 nm has been deposited at the bottom of the cutout 514 in the process.

After the deposition of the barrier layer 530 and before the cutouts 514 and 522 are filled with copper, a long heat treatment step is carried out, in which the barrier material at the bottom of the cutout 514 diffuses into the copper interconnect 506 along grain boundaries. An interface diffusion of the barrier material arranged at the bottom of the cutout 514 along the interface between the interconnect 506 and the dielectric barrier layer 508 additionally occurs. In the exemplary embodiment, the thermal activation is carried out in a furnace. Therefore, heat treatment is effected in a hydrogen atmosphere, with nitrogen being added. The hydrogen proportion has a reducing effect and prevents oxidation of the exposed copper of the interconnect 506. The nitrogen proportion serves for densifying the barrier layers that are not removed during the heat treatment. By way of example, forming gas mixtures are used during the heat treatment. The cooling was carried out rapidly, that is to say with a cooling rate of greater than 50 kelvins/minute, in order that tantalum situated in copper grain boundaries of the interconnect 506 is "frozen" there. At the bottom of the cutout 514, the tantalum barrier was typically less than 15 nm. The resolution of the tantalum barrier at the bottom of the cutout 514 is therefore effected comparatively rapidly. The tantalum/silicon dioxide interface is stable up to 600° C. Consequently no reaction or diffusion whatsoever takes place at the tantalum/silicon dioxide interface. The result is a barrier-free via/interconnect transition.

Moreover, the following further positive aspects apply to the exemplary embodiment of FIG. 9:

use of nitrogen in the heat treatment gas results in the densification of the tantalum barrier or the tantalum nitride barrier at the tantalum/silicon dioxide interfaces, in particular at the upper tantalum/silicon dioxide interfaces. This is particularly important at silicon nitride undercut edges, which typically constitute weak points in the via or at the bottom of the interconnect.

the barrier deposition process can deliberately be set in non-conformal fashion, e.g. with deliberately little tantalum coverage at the via bottom, as a result of which comparatively short heat treatment times are required, and cost-effective batch processes are possible in which a plurality of wafers, for example more than 80 wafers, are heat-treated simultaneously, so that a high throughput is possible even with heat treatment times of one hour or more.

FIG. 10 shows a circuit arrangement 500b constructed like the circuit arrangement 500, so that identical elements are identified by the same reference symbols but followed by the lower-case letter b. During the production of the circuit arrangement 500b, in contrast to the production of the circuit arrangement 500, however, the longer heat treatment operation for the removal of the barrier material 530b at the bottom of the cutout 514b or the via conductive structure 550b is carried out only when the copper material for the via conductive structure 550b and for the interconnect 560b has been deposited. Moreover, in the exemplary embodiment the copper material has already been planarized and a dielectric barrier layer 750, e.g. a silicon nitride layer, has been deposited.

In the exemplary embodiment in accordance with FIG. 10, barrier material diffuses between the via conductive structure 550b and the interconnect 506b during the long heat treatment both along grain boundaries into the interconnect 506b and into the via conductive structure 550b. An interface diffusion along the Interface between copper/silicon nitride layer 508b additionally occurs again.

The barrier layer 530b is optionally deposited in non-conformal fashion and in a manner thicker than required. A partial resputtering step, which thins the barrier from the horizontal dielectric areas and at the via bottom and simultaneously thickens it at the lower via sidewall, is likewise optional.

In the exemplary embodiment in accordance with FIG. 10, the following technical effects result:

use of nitrogen in the heat treatment gas brings about a densification of the silicon nitride cap layer 570 at the copper/silicon nitride interfaces and thus a stabilization and improvement in the quality of said interface, the tantalum/silicon dioxide interface is stable up to 600° C., no reaction or diffusion whatsoever takes place here, this procedure simultaneously brings about an improvement in the copper/silicon nitride Interface by means of tantalum Interface diffusion in the different levels, as explained above with reference to FIGS. 1 to 8B, this variant is used particularly after the complete production of all the interconnect levels and it only has to be performed once, and if the metallization is produced using single damascene technology rather than dual damascene technology, the method in accordance with this exemplary embodiment can likewise be used. The barrier is then broken down particularly rapidly at the via(n)/interconnect(n) via(n)/interconnect (n+1) transitions, because the grain boundary diffusion is possible in a plurality of directions there. Consequently, both interfaces afforded by the single damascene technique are broken down. This results in barrier-free via/track transitions.

FIG. 11 shows a circuit arrangement 600 containing a substrate 601 with a multiplicity of semiconductor components. The circuit arrangement 600 additionally contains an insulating layer 602 produced by a dielectric material 604, in which a copper interconnect 606 is arranged. After the production of the copper interconnect 606 by means of a single damascene method or with the aid of a dual damascene method, a dielectric barrier layer 608 was deposited, for example a silicon nitride layer. Insulating material 612 was subsequently deposited for a via layer 610. A single damascene method was used to produce a via conductive structure 650 adjoining, at the sidewalls and at the bottom, a barrier layer 630, for example a tantalum barrier layer having a layer thickness of 20 nm in the upper region of the via conductive structure 650. After a CMP step, a dielectric barrier 670 was deposited, for example a silicon nitride layer having a layer thickness of 50 nm. A barrier layer 680 was then deposited, for example a tantalum barrier layer having a layer thickness of 20 nm. With the aid of a "subtractive" method, an interconnect 690 was subsequently produced and covered with a silicon nitride layer 700 at its top area and at its lateral areas. A barrier layer made of tantalum is optionally arranged between the silicon nitride layer 700 and the interconnect 690, see the explanations regarding FIGS. 8A and 8B.

After the production of the interconnect 690, a long heat treatment step is carried out, in which the barrier material 630 is removed between the via conductive structure 650 and the interconnect 606. In addition, material of the barrier layer 680 is removed between the via conductive structure 650 and the interconnect 690 during this long heat treatment step. The majority of the barrier layer diffuses along grain boundaries of the interconnect 606, the via conductive structure 650 and the interconnect 690, respectively. However, in particular edge regions of the barrier material to be removed are also transported by interface diffusion along the copper/silicon nitride interface of the interconnect 606 and the barrier layer/silicon nitride interface of the barrier layer 680.

The same advantages which have been explained above with reference to FIGS. 9 and 10 are afforded in the exemplary embodiment in accordance with FIG. 11. In a further exemplary embodiment, the diffusion-governed removal of the barrier material from tantalum/copper contact areas is combined with the diffusion-governed improvements in the copper/silicon nitride interface which have been explained with reference to FIGS. 1 to 8B. As a result, the required thermal activation steps can be carried out with a tenable temperature budget even for sensitive BEOL processes (Back End of Line).

In order to achieve the positive effects described, it is not absolutely necessary to completely remove the barrier at the via bottom or at the via top area. A partial removal already suffices, e.g. local tears, if a partial direct copper/copper contact is thereby achieved and a largely unimpeded copper material flow can then take place when the electromigration commences. The required thermal budget for removing the barrier at the via bottom or at the via top area to the greatest possible extent is controlled by the layer thickness of the barrier at these locations. A combination of the methods explained with resputtering steps is carried out in further exemplary embodiments. However, the barrier at the via bottom need not be completely removed, but rather only thinned, by means of the resputtering. The barrier layer thus also remains at other horizontal locations, e.g. at the bottom of an interconnect. By means of the resputtering the material removed at the via bottom is deposited in the lower region of the via sidewalls, so that the layer thickness is increased there. This prevents the barrier from being "resolved" in the lower region of the via sidewalls and losing its required protective effect here, or prevents it from being removed at other horizontal locations (e.g. bottom of the interconnect) due to an excessively long resputtering step.

An SEM micrograph of a Cu-MLM (multilayer metallization) after a heat treatment at 450° C. for ten hours was examined. Given a via diameter at the via bottom of 500 nm, a previously existing barrier was no longer discernible after this heat treatment time.

In the exemplary embodiments, what is common, inter alia, to the removal of barrier material and the coating with barrier material by long-term heat treatment is:
  initial amorphization of the initially crystalline original barrier,
  and primarily the self-alignment of the methods, which does not require lithography methods and is very reliable from a process-technological standpoint.

The thickness of the amorphous zone is, in particular, less than 10 nanometers. Moreover, the amorphous-zone comprises at least 80 atomic percent of barrier material. The amorphous zone is arranged e.g. between a crystalline barrier and the crystalline Cu conductive structure. The amorphous barrier was deposited in another exemplary embodiment.

In another exemplary embodiment, electrically nonconductive, that is to say dielectric barriers, e.g. $Ta_2O_5$, $Al_2O_3$, $HfO_2$ or a silicon-containing compound, are also used for the diffused barrier material, in particular for the interface-diffused barrier material.

Heat treatment times for Interface diffusion operations are calculated according to the following formula:

$$t(\min) = l(\min)^2/D \quad (1)$$

where $t(\min)$=minimum heat treatment time, $D=D_o*\exp(Ea/kT)$; $l(\min)=\frac{1}{2}$ minimum track width for interface diffusion, and the estimated constants: $D_o=6*10^{-17} cm^2/s$; $Ea=1.68$ eV for interface diffusion.

The same formula can also be used for the calculation of the heat treatment time for the removal of barrier material, where $Ea=1.82$ eV for grain boundary diffusion and the heat treatment time is also dependent on the number of grain boundaries adjoining the barrier to be removed.

As a person skilled in the art will readily appreciate, the above description is meant as an illustration of Implementation of the principles this invention. This description is not intended to limit the scope or application of this invention in that the invention is susceptible to modification, variation and change, without departing from the spirit of this invention, as defined in the following claims.

What is claimed is:

1. A method for processing an integrated circuit arrangement comprising a via conductive structure disposed over an interconnect and a barrier material layer disposed between the via conductive structure and the interconnect, the barrier material layer comprising an electrically conductive barrier material, the method comprising:
  removing a portion of the barrier material layer, the portion located between the via conductive structure and the interconnect, by performing one or more heat treatments, wherein in response to the one or more heat treatments, the barrier material layer at least partially diffuses at least into the interconnect along grain boundaries of the interconnect leaving no part of the barrier material layer between the via conductive structure and the interconnect.

2. The method as claimed in claim 1, wherein the barrier material layer in response to the one or more heat treatments further is removed from between the via conductive structure and the interconnect by interface diffusion along an interface between two different materials.

3. The method as claimed in claim 1, wherein when the barrier material layer to be removed has a thickness of up to 2 nanometers, and the one or more heat treatments are effected in total for more than 1.5 hours, or when the barrier material layer to be removed has a thickness in the range of 2 nanometers to 5 nanometers, and the one or more heat treatments are effected in total for more than 3 hours, the temperature during heat treatment being 430° Celsius.

4. The method as claimed in claim 1, wherein the barrier material layer to be removed is transported into the interconnect along the grain boundaries by at least 5 nanometers during the heat treatment.

5. The method as claimed in claim 1, wherein the via conductive structure comprises copper or a copper alloy having at least 90 atomic percent of copper, or wherein the via conductive structure comprises gold or a gold alloy having at least 90 atomic percent of gold.

6. The method as claimed in claim 1, wherein the barrier material layer is electrically conductive, or wherein the barrier material layer comprises a dielectric barrier material, or wherein the barrier material layer comprises a material which does not form an alloy with the interconnect material and which is not soluble or only slightly soluble in the interconnect material, or wherein the barrier material comprises a material which forms alloys with the interconnect material or which is soluble therein.

7. The method as claimed in claim 6, wherein the barrier material layer comprises tantalum, tantalum nitride, titanium, titanium nitride, tungsten, tungsten nitride, titanium-tungsten, tantalum oxide, aluminum oxide or hafnium oxide.

8. A method for processing an integrated circuit arrangement comprising an insulating layer, the method comprising:
  forming an opening in the insulating layer;
  forming an electrically conductive barrier layer on sidewalls and a bottom surface of the opening;
  forming a conductive structure by depositing a metal in the opening;

forming a dielectric barrier layer at least over a top surface of the conductive structure, wherein the top surface of the conductive structure faces away from the bottom surface of the opening;

coating at least the top surface of the conductive structure by performing one or more heat treatments, wherein in response to the one or more heat treatments, barrier material from the electrically conductive barrier layer transports by interface diffusion along an interface between the conductive structure and the dielectric barrier layer.

9. The method as claimed in claim 8, wherein after the conductive structure is formed and before the dielectric barrier layer is formed, forming a secondary electrically conductive barrier layer that partially covers the top surface of the conductive structure so as to be located between the dielectric barrier layer and the conductive structure, and wherein in response to the one or more heat treatments, barrier material diffuses out from the second electrically conductive barrier layer to coat at least the top surface of the conductive structure.

10. The method as claimed in claim 9, wherein the electrically conductive barrier layer is an amorphous layer.

11. The method as claimed in claim 10, wherein the amorphous layer comprises tantalum, tantalum nitride, titanium, titanium nitride, tungsten, tungsten nitride, titanium-tungsten, tantalum oxide, aluminum oxide or hafnium oxide.

12. The method as claimed in claim 8, wherein the transport distance of the barrier material during heat treatment with interface diffusion is greater than 10 nanometers.

13. The method as claimed in claim 8, wherein the conductive structure is heat-treated at least for a time which results from the following formula: $t = l^2/D$ where $D = D_o \ast \exp(E_a/kT)$; $l$=half the minimum track width in the circuit arrangement; $D_o = 6 \ast 10^{-17}$ cm 2/s; $E_a = 1.68$ eV for interface diffusion, $k$=Boltzmann's constant, $T$=temperature, the temperature t during heat treatment in this case being greater than 420° Celsius and less than 510° Celsius.

14. The method as claimed in claim 8, wherein the conductive structure comprises copper or a copper alloy having at least 90 atomic percent of copper, or wherein the conductive structure comprises gold or a gold alloy having at least 90 atomic percent of gold.

* * * * *